March 10, 1970 E. C. MERCIER 3,500,221
FAST RESPONSE CURRENT AMPLIFIER
Filed Jan. 16, 1968
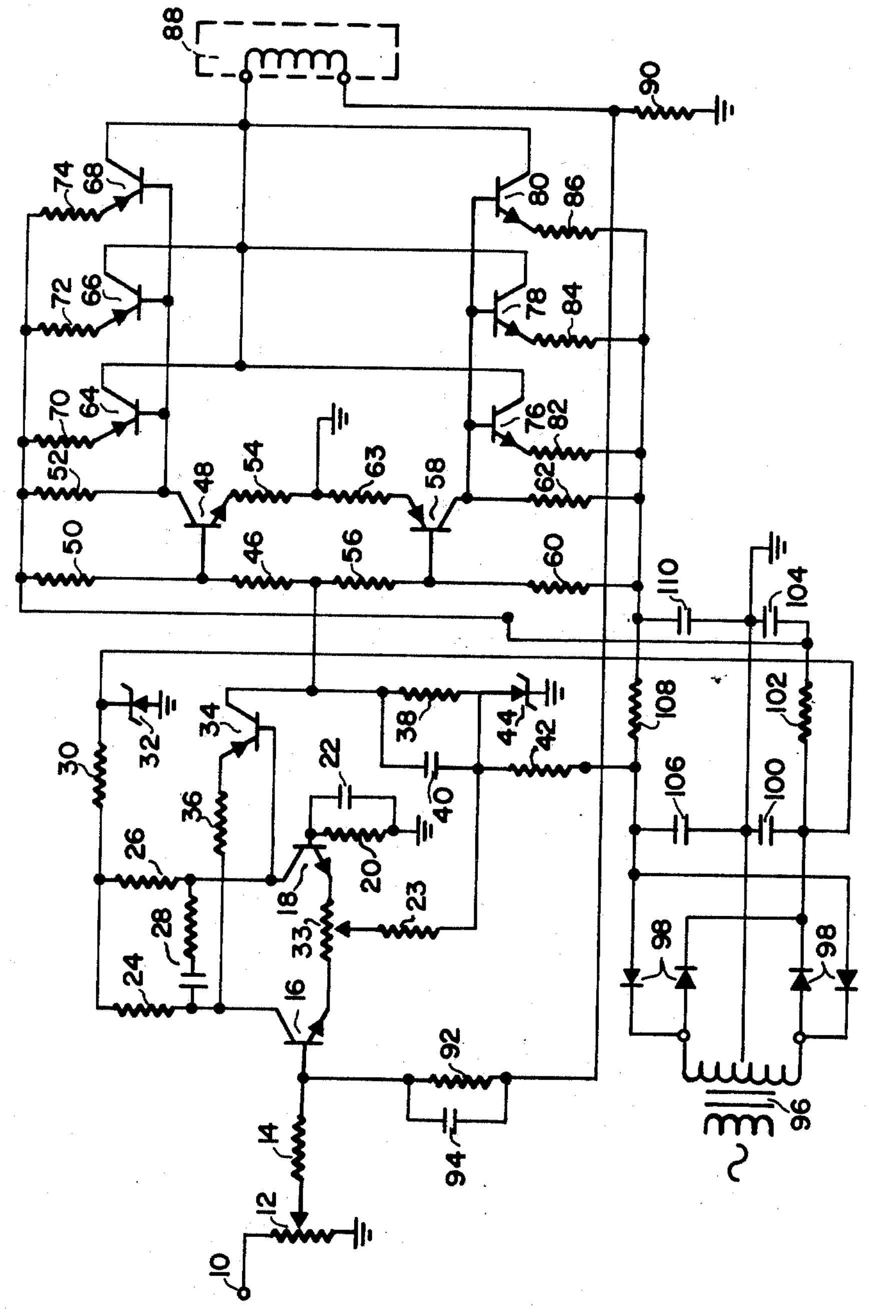
INVENTOR.
ERNEST C. MERCIER
BY [signature]
ATTORNEY

United States Patent Office 3,500,221

Patented Mar. 10, 1970

3,500,221

FAST RESPONSE CURRENT AMPLIFIER

Ernest C. Mercier, Rockville, Md., assignor to Singer-General Precision, Inc., a corporation of Delaware Filed Jan. 16, 1968, Ser. No. 698,307

Int. Cl. H03f *3/18, 3/68*

U.S. Cl. 330—17 2 Claims

ABSTRACT OF THE DISCLOSURE

A high current output direct coupled amplifier for small signal operation in the frequency range of between D.C. and one megahertz and a large signal risetime of 12 microseconds is particularly suited for use as a cathode ray tube magnetic deflection yoke amplifier. The amplifier uses a simple nonregulated power supply and achieves linearity and stability through voltage and current feedback and compensation techniques.

This invention relates to signal amplifiers and more particularly to a novel, fast response, direct coupled, wide band amplifier for producing high current signals such as is required for cathode ray tube deflection coils or the like.

It is one object of this invention to provide a simple and inexpensive signal amplifier for producing high current output signals at a very fast response time.

It is another object of this invention to provide a small signal amplifier for operation in the frequency range of between D.C. and approximately one magahertz.

Briefly described, the amplifier comprises a differential input amplifier driving a class A stage which is coupled to complementary-symmetry class B drivers and current amplifiers. The output signal from the current amplifiers is directly coupled to a first load terminal, the second terminal of which is connected to ground through a low resistance across which a current feedback signal is developed for return to the differential amplifier input to provide linearity characteristics of better than 0.1 percent. The amplifier uses a simple, non-regulated power supply which is coupled directly to the class B current amplifiers through a small series resistance, which provides a very fast transient response and full supply power at the instant the amplifiers are enabled, and reduced power as the conduction of the amplifiers is increased.

In the drawings, the single figure is a schematic circuit diagram of an amplifier embodying the invention.

Referring to the figure, an input signal of ±5 volts is applied to input terminal 10 which is coupled through a potentiometer 12, of approximately 100 ohms, to ground. The adjustable arm of potentiometer 12 is coupled through resistance 14, which may have a value of 1.0 kilohm, to the base of NPN transistor 16, which together with transistor 18 is connected as a differential amplifier in a single header. Accordingly, the base of transistor 18 is coupled to ground through a resistance 20, which may have a valve of 1 kilohm, and which is shunted with a suitable capacitor 22. The emitters of transistors 16 and 18 are coupled together through a potentiometer 23, which may have a value of 100 ohms, and the collectors of transistors 16 and 18 are connected through resistances 24 and 26, respectively, to a positive bus which is maintained at 15 volts by 1 kilohm resistance 30 in series with a 40-volt source, and a 15-volt Zener diode 32, the anode of which is connected to ground. Similarly, the moveable arm of potentiometer 33 is connected to a negative bus through a 1 kilohm resistance 23. The negative bus is maintained at 15 volts by a 15-volt Zener diode 44 and a resistance 42, which is connected to the negative source of a 40-volt power supply.

The output of the differential amplifier is taken from the collector of transistor 18 which is connected directly to the base of PNP transistor 34, the emitter of which is connected through a resistance 36, which may have a value of 400 ohms, to the collector of input transistor 16. By thus connecting the emitter of PNP transistor 34 to the collector of NPN transistor 16, a temperature compensation is achieved since a PNP transistor will drift in the opposite direction to that of an NPN transistor and correct for $V_{be}$ changes. The collector of transistor 34 is connected to a 15-volt negative bus through a resistance 38, which may have a value of 3.3 kilohms, suitably shunted by a bypass capacitor 40. Because of the respective voltages applied to the differential amplifier stage comprised of transistors 16 and 18, and to transistor 34, both of these stages are operated as class A amplifiers.

The output from the class A amplifier stage comprising transistor 34 is taken from the collector of 34. This point, which is at approximately zero volts when no input signal is applied to terminal 10, is connected to complementary-symmetry driver amplifiers 48 and 58 and current amplifiers comprising transistors 64, 66, 68, and 76, 78, 80. These stages operate in the class B mode; transistors 64, 66, 68 amplify the positive signals and transistors 76, 78, 80 amplify only the negative going signals produced by the class A operation of transistor 34.

The collector of transistor 34 is connected to the base of NPN transistor 48 through a resistance 46 and to the base of PNP transistor 58 through a resistance 56. Both resistances 46 and 56 may have a value of 500 ohms. Bias is provided to transistor 48 by connecting a resistance 50 between the base and a positive bus which normally carries 40 volts; similarly, bias is provided at transistor 58 by a resistance 60 connected between the base and a negative bus which is normally maintained at −40 volts. Both resistance 50 and 60 may have a value of 27 kilohms and the bias thus applied to the bases of transistors 48 and 58 is such that these transistors operate in the class B mode. The collector of NPN transistor 48 is coupled to the positive bus through a resistance 52 which may have a value of 500 ohms and the collector of transistor 58 is connected to the negative bus through resistance 62 which is identical to resistance 52. The emitters of transistors 48 and 58 are connected together through series resistances 54 and 63, each of which may have a value of 47 ohms and the junction of these resistances is connected to ground reference.

The final amplification stages are coupled to the collectors of transistors 48 and 58. In the embodiment illustrated, the collector of transistor 48 is connected to the bases of three parallel transistors 64, 66, and 68, each of which may be a PNP type 2N3792 transistor, which, when conductive, will produce a signal current from their combined collectors of approximately 15 amperes. The emitters of these transistors are connected to the positive bus through small resistances 70, 72, and 74, respectively, each of which may have a value of 2 ohms The collector of transistor 58 is connected to the bases of transistors 76, 78, and 80, which may be NPN type 2N3716 transistors. As in the case of transistors 64, 66, and 68, the emitters of transistors 76, 78, and 80 are coupled to the negative bus through small resistances 82, 84, and 86, respectively, each of which may have a value of 2 ohms. The collectors of transistors 64, 66, 68, and 76, 78, and 80 are joined together. One terminal of the load 88, which may be a resistance or an inductance, such as a cathode ray tube deflection yoke coil, is connected to this symmetrical junction of the complementary-symmetry amplifier transistors. The second terminal of load 88 is connected as shown to ground through a small resistance 90, the value of which must be ascertained by the value of the particular load 88. For a standard deflection coil an inductance of 30 millihenries, the value of resistance 90 may be 0.2 ohm. The purpose of resistance 90 is to provide a signal source from which a current feedback line may be coupled through a feedback circuit comprising resistance 92 in parallel with capacitor 94, to the amplifier input at the base of input transistor 16.

The power supply contributes greatly to the speed and linearity of the amplifier. The power supply is a simple nonregulated symmetrical positive and negative power supply comprising a power transformer 96 having a center tapped secondary winding which is connected to ground reference. A standard bridge rectifier comprised of four diodes 98 is coupled to the secondary winding to provide at its output both a positive potential and a negative potential of 40 volts. As previously described, the positive 40-volt line is connected to the differential input amplifier where it is reduced to a value of 15 volts by series resistance 30 and a 15-volt Zener diode. Similarly, the negative 40-volt line is applied to the differential input amplifier where it is reduced to a negative 15 volts by the series resistance 42 and the Zener diode 44. Each of these lines is filtered by large filter capacitors 100 and 106, respectively, each of which may have a value of 4,500 microfarads. The positive bus from the power supply is coupled to the emitters of the current amplifiers 64, 66, and 68 through voltage dropping resistance 102 which may have a value of 3 ohms, and capacitor 104, having a value of two microfarads, is connected between this line and ground. Similarly, the negative bus from the power supply is coupled to the emitters of transistors 76, 78, and 80 through a series resistance 108 which may have a value of 3 ohms. A 2-microfarad capacitor 110 also bypasses this line to ground.

The use of resistances 102 and 108 in the power supply circuit effectively provides a voltage feedback from the current amplifiers. When there is no input signal at terminal 10, none of the current amplifiers is enabled and the full value of 40 volts is applied to their emitters. Upon the application of an input signal to terminal 10 of a particular polarity, either PNP transistors 64, 66, and 68, or NPN transistors 76, 78, and 80 will be enabled, and current will be drawn either through resistance 102, or 108, respectively. As this current is passed through one of these resistances, 102 or 108, there will be an appreciable IR drop so that the output signal seen by load 88 will be linear and in accordance with the signal appearing at input terminal 10. As noted above, the linearity of the amplifier is further improved by the use of the feedback circuit, which is supplied by the signal generated across resistance 90. This feedback is a current feedback and is degenerative to provide high linearity and stability to the amplifier.

Having described an embodiment of the invention, what is claimed is:

1. A wide band, fast response, high current output, direct coupled amplifier comprising:

an input stage including first and second NPN transistors connected as a class A differential amplifier;

signal input circuitry coupled to the base of said first transistor;

a class A amplifier stage comprising a PNP transistor having its base directly coupled to the collector of the second NPN transistor of said input stage, the emitter of said PNP transistor being coupled to the collector of the first NPN transistor in said input stage to provide temperature stabilization;

a complementary-symmetry class B driver stage coupled to said class A amplifier stage;

at least one complementary-symmetry class B current amplifier coupled to said driver stage;

output circuitry means for coupling a load between the symmetrical junction of said current amplifier and ground reference; and a nonregulated symmetrical direct current power source coupled to said complementary-symmetry current amplifier through voltage dropping resistances.

2. The wide band amplifier claimed in claim 1, wherein said output means includes a resistance between the load and ground reference and further includes current feedback circuit means for sampling the signals generated across said resistance and applying said signals to said signal input circuitry.

References Cited

UNITED STATES PATENTS

| | | | |
|---|---|---|---|
| 3,277,385 | 10/1966 | Matsumoto | 330—17 X |
| 3,363,191 | 1/1968 | Boughtwood et al. | 330—22 X |

OTHER REFERENCES

Bronzite, "A Wideband Amplifier For An Inductive Load," Electronic Engineering, January 1966, pp. 24–30.

Electronic Design, Oct. 25, 1966, p. 30.

ROY LAKE, Primary Examiner

J. B. MULLINS, Assistant Examiner

U.S. Cl. X.R.

330—22, 23, 28, 30